(12) United States Patent
Zhang et al.

(10) Patent No.: US 11,424,247 B1
(45) Date of Patent: Aug. 23, 2022

(54) SEMICONDUCTOR MEMORY DEVICE HAVING A SECOND ACTIVE REGION DISPOSED AT AN OUTER SIDE OF A FIRST ACTIVE REGION

(71) Applicant: Fujian Jinhua Integrated Circuit Co., Ltd., Quanzhou (CN)

(72) Inventors: Janbo Zhang, Zhangzhou (CN);
Enping Cheng, Quanzhou (CN);
Li-Wei Feng, Tainan (TW); Yu-Cheng Tung, Kaohsiung (TW)

(73) Assignee: Fujian Jinhua Integrated Circuit Co., Ltd., Quanzhou (CN)

( * ) Notice: Subject to any disclaimer, the term of this patent is extended or adjusted under 35 U.S.C. 154(b) by 0 days.

(21) Appl. No.: 17/336,275

(22) Filed: Jun. 1, 2021

(30) Foreign Application Priority Data

May 7, 2021 (CN) .......................... 202110495955.9
May 7, 2021 (CN) .......................... 202120962589.9

(51) Int. Cl.
*H01L 27/108* (2006.01)

(52) U.S. Cl.
CPC .. *H01L 27/10823* (2013.01); *H01L 27/10876* (2013.01); *H01L 27/10885* (2013.01); *H01L 27/10888* (2013.01)

(58) Field of Classification Search
CPC .............. H01L 27/07; H01L 27/10823; H01L 27/10876; H01L 51/0562
USPC ....................................................... 257/204
See application file for complete search history.

(56) References Cited

U.S. PATENT DOCUMENTS 9,704,816 B1    7/2017  Huang

FOREIGN PATENT DOCUMENTS

CN      112133699          12/2020
WO   WO-2021153266 A1 *   8/2021

OTHER PUBLICATIONS

The specification, including the claims, and drawings in the CN application No. 202022661807.3, Filing Date: Nov. 17, 2020.
Huang, the specification, including the claims, and drawings in the U.S. Appl. No. 15/296,942, filed Oct. 18, 2016.

* cited by examiner

*Primary Examiner* — Hoai V Pham
(74) *Attorney, Agent, or Firm* — Winston Hsu

(57) ABSTRACT

The present disclosure relates to a semiconductor memory device and a method of fabricating the same, and the semiconductor memory device includes a substrate, an active structure and a shallow trench isolation. The active structure is disposed within the substrate and includes a first active region and a second active region. The first active region includes a plurality of active region units, and the second active region is disposed at an outer side of the first active region to directly connect to a portion of the active region units. The second active region includes a plurality of first openings disposed an edge of the second active region. The shallow trench isolation is disposed within the substrate, to surround the active structure.

14 Claims, 7 Drawing Sheets

SEMICONDUCTOR MEMORY DEVICE HAVING A SECOND ACTIVE REGION DISPOSED AT AN OUTER SIDE OF A FIRST ACTIVE REGION

BACKGROUND OF THE INVENTION

1. Field of the Invention

The present disclosure generally relates to a semiconductor memory device and a method of fabricating the same, and more particularly, to a semiconductor memory device having active regions and shallow trench isolations and a method of fabricating the same.

2. Description of the Prior Art

With the miniaturization of semiconductor devices and the complexity of integrated circuits, the size of elements is continuously shrinking and the structure is constantly changing. Therefore, maintaining the performance of small-sized semiconductor elements is the standard purpose of the present industry. In the semiconductor fabricating process, most of the active areas (AAs) are defined on the substrate as a bass element, and then, the required elements are further formed on the AAs. Generally, the AAs are plural patterns formed within the substrate through the photolithography and etching processes. However, due to the sized-shrinking requirements, the width of the AAs has been gradually reduced, and the pitch between the AAs has also been gradually reduced thereby, so that, the fabricating process of AAs encounters plenty limitations and challenges that fails to meet the practical product requirements.

SUMMARY OF THE INVENTION

One of the objectives of the present disclosure provides a semiconductor memory device and a fabricating method thereof, in which the semiconductor memory device includes an active structure having a second active region disposed around an outer side of a first active region, wherein the second active region further includes a plurality of openings disposed thereon with the locations of the openings being in alignment with particular bit lines and contacts disposed on the particular bit lines, respectively. Accordingly, it is sufficient to avoid the directly connection between the bit lines and the word lines, and the semiconductor memory device may achieve better element performance.

To achieve the purpose described above, one embodiment of the present disclosure provides a semiconductor memory device including a substrate, an active structure and a shallow trench isolation. The active structure is disposed in the substrate, and includes a first active region and a second active region, the first active region includes a plurality of active region units parallel with each other and extending along a first direction, and the second active region is disposed at an outer side of the first active region. The second active region includes a first edge extending along a second direction and a second edge extending along a third direction, and the first edge and the second edge directly connected to a portion of the active region units, wherein the second active region comprises a plurality of first openings, and the first openings are disposed on the second edge. The shallow trench isolation is disposed in the substrate to surround the active structure.

To achieve the purpose described above, one embodiment of the present disclosure provides a method of fabricating a semiconductor memory device including the following steps. Firstly, a substrate is provided, and an active structure is formed in the substrate, wherein the active structure includes a first active region and a second active region, the first active region includes a plurality of active region units parallel with each other and extending along a first direction, and the second active region is disposed at an outer side of the first active region. The second active region includes a first edge extending along a second direction and a second edge extending along a third direction, and the first edge and the second edge directly connected to a portion of the active region units, wherein the second active region further includes a plurality of first openings disposed on the second edge. Then, a shallow trench isolation is formed in the substrate to surround the active structure.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

FIG. 1 to FIG. 4 are schematic diagrams illustrating a semiconductor memory device according to a first preferable embodiment in the present disclosure, wherein:

FIG. 1 shows a top view of an active structure of a semiconductor memory device;

FIG. 2 shows a top view of a semiconductor memory device;

FIG. 3 shows a cross-sectional view taken along a straight cross line A-A' in FIG. 2; and FIG. 4 shows a cross-sectional view taken along a bend cross line B-B' in FIG. 2.

DETAILED DESCRIPTION

To provide a better understanding of the presented disclosure, preferred embodiments will be described in detail. The preferred embodiments of the present disclosure are illustrated in the accompanying drawings with numbered elements. In addition, the technical features in different embodiments described in the following may be replaced, recombined, or mixed with one another to constitute another embodiment without departing from the spirit of the present disclosure.

Figure 1:
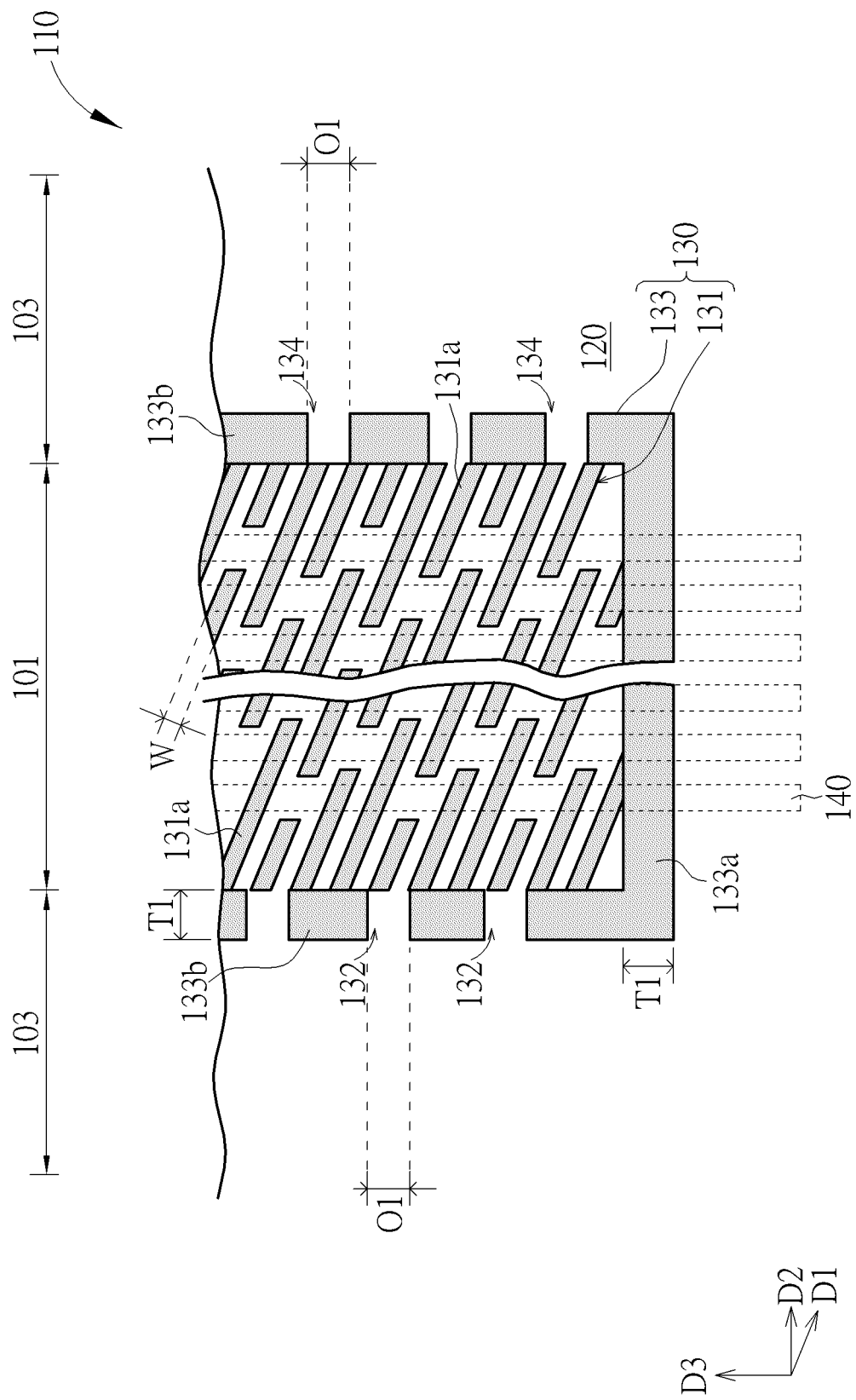
Figure 2:
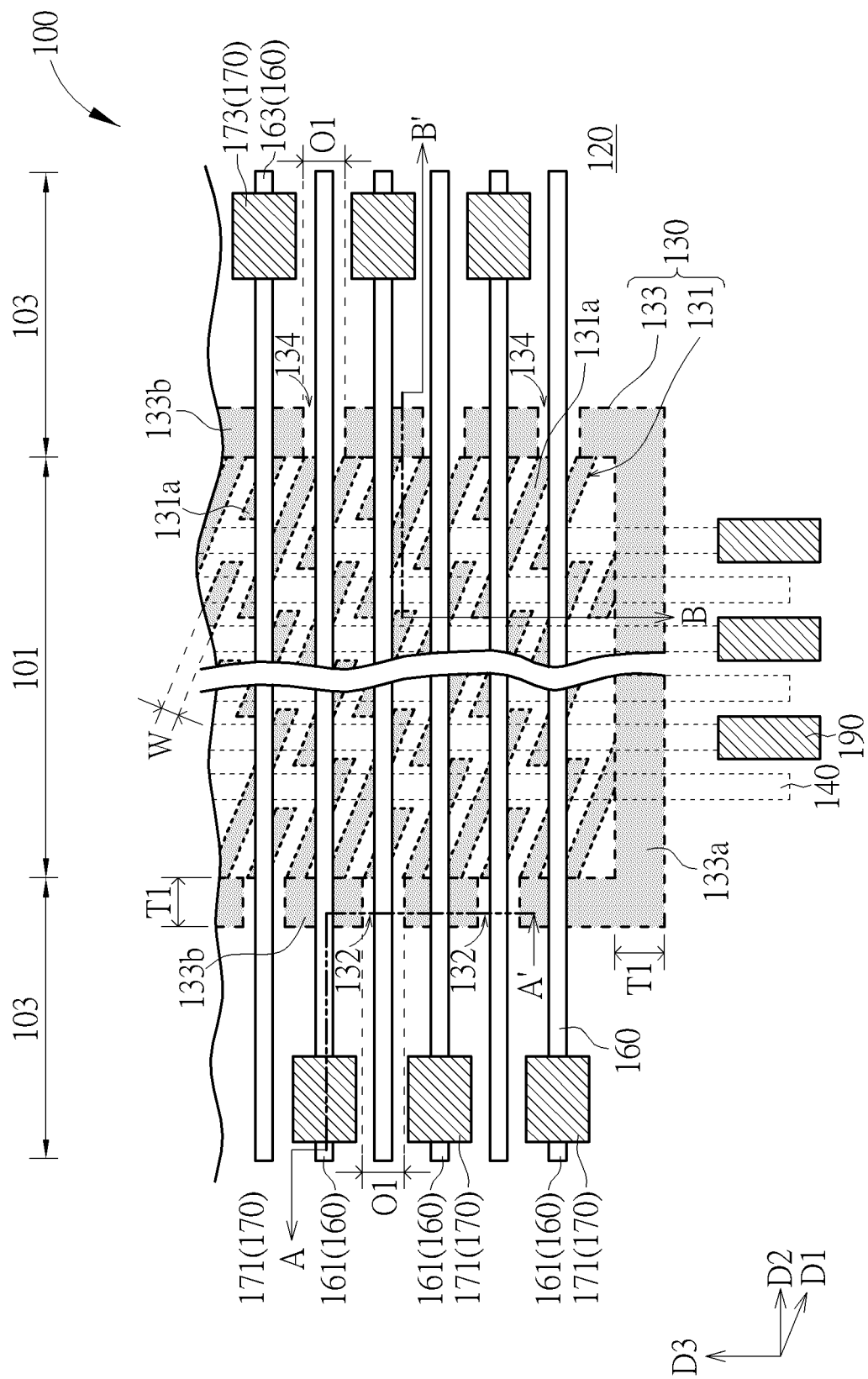
Figure 3:
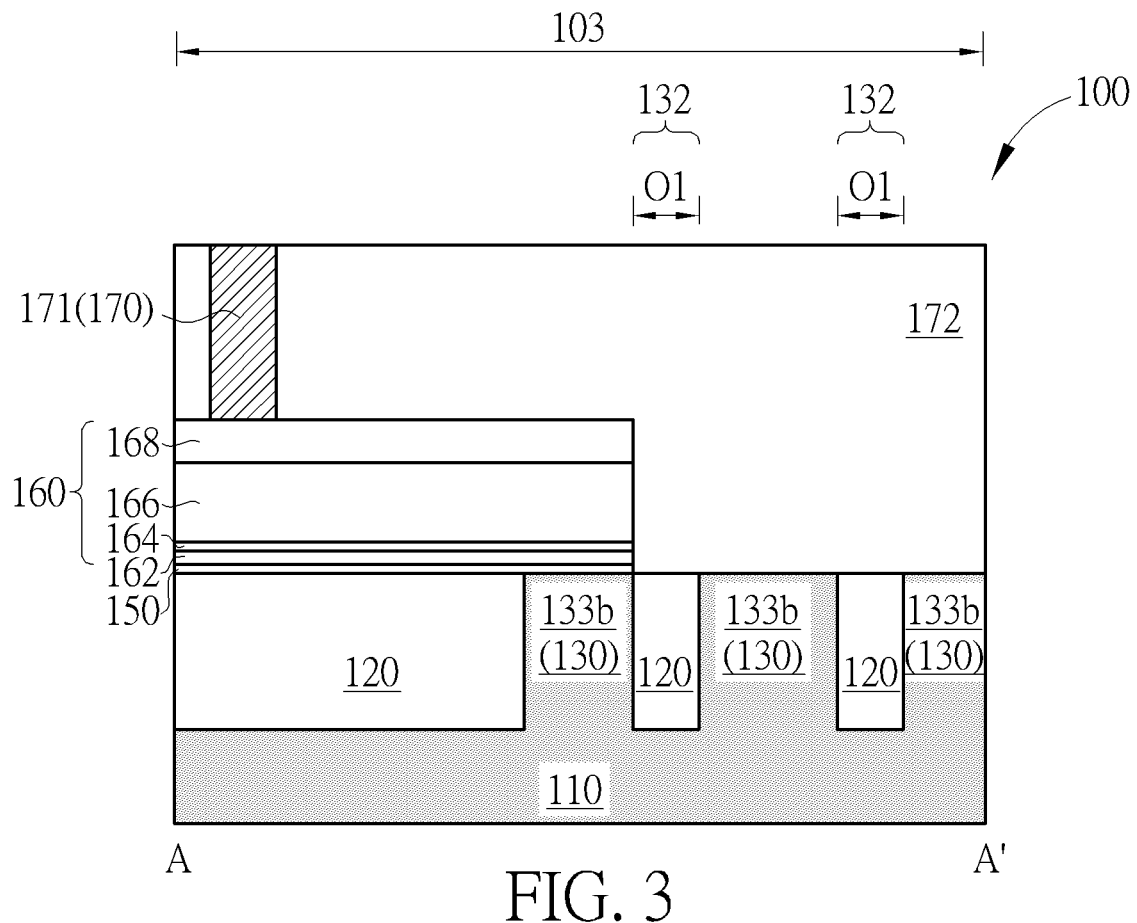
Figure 4:
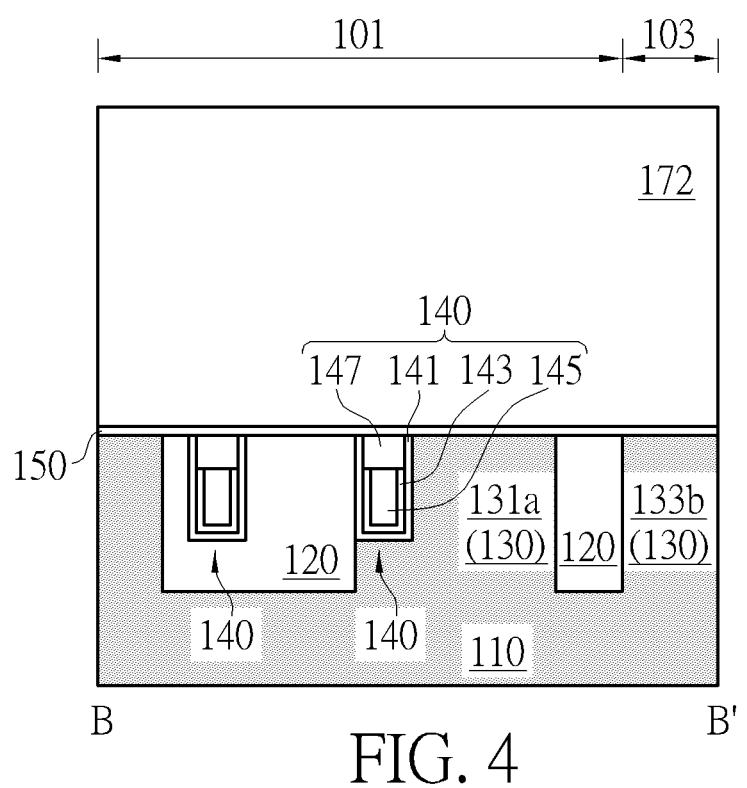

Please refer to FIGS. 1-4, which illustrate schematic diagrams of a semiconductor memory device 100 according to the first preferable embodiment in the present disclosure, with FIG. 1 and FIG. 2 respectively illustrating a top view of the semiconductor memory device 100, and with FIG. 3 and FIG. 4 respectively illustrating a cross-sectional view of the semiconductor memory device 100. It is noted that FIG.

3 and FIG. 4 show the cross-sectional views taken along a bend line direction (namely, the bend cross line B-B') and a straight line direction (namely, the straight cross line A-A'), respectively. The semiconductor memory device 100 includes a substrate 110 for example a silicon substrate, a silicon containing substrate (such as SiC or SiGe), or a silicon-on-insulator (SOI) substrate, and at least a shallow trench isolation (STI) 120 in the substrate 110, to define an active structure 130 in the substrate 110. That is, the shallow trench isolation 120 is disposed around the active structure 130. Precisely speaking, the active structure 130 further includes a first active region 131 disposed within a first region 101 and a second active region 133 disposed within a second region 103, wherein the first region 101 is an area being highly integrity in the semiconductor memory device 100, such as a memory cell region, and the second region 103 is an area being lower integrity in the semiconductor memory device 100, such as a peripheral region, but is not limited thereto. The second region 102 is for example disposed at an outer side of the first region 101, as shown in FIGS. 1 and 2.

As shown in FIG. 1 and FIG. 2, the first active region 131 includes a plurality of active region unit 131a which are parallel and separately extended along a first direction D1, and the active region unit 131a are alternately arranged along the first direction D1, with the first direction D1 being not perpendicular to the x-direction (such as a second direction D2) or the y-direction (such as a third direction D3). In one embodiment, each of the active region units 131a are sequentially arranged into a plurality of rows in the second direction D2, to present a particular arrangement thereby, such as an array arrangement as shown in FIGS. 1 and 2, but is not limited thereto. The formation of the first active region 131 may be accomplished by but is not limited to the following patterning process. For example, a mask layer (not shown in the drawings) may be firstly formed on the substrate 110, with the mask layer including patterns for defining the active region units 131a of the first active region and with a portion of the substrate 110 being exposed form the mask, and an etching process is performed by using the mask layer, to remove the portion of the substrate 110 and to form at least a shallow trench (not shown in the drawings). Then, an insulating material (not shown in the drawings) such as silicon oxide (SiO$_x$), silicon nitride (SiN) or silicon oxynitride (SiON) may be filled in the shallow trench, to form the shallow trench isolation 120 having coplanar topmost surface with the top surface of the substrate 110, and to simultaneously define the first active region 131, as shown in FIG. 3. In one embodiment, the formation of the first active region 131 may also be accomplished by a self-aligned double patterning (SADP) process or a self-aligned reverse patterning (SARP) process, but not limited thereto.

On the other hand, the second active region 133 is disposed around an outer side of the first active region 131. In the present embodiment, the second active region 133 further includes at least a first edge 133a extended along the second direction D2, and at least two second edges 133b extended along the third direction D3. Each of the two second edge 133b is opposite to one another, and adjacent to the first edge 133a, such that, the whole second active region 133 may therefore perform like a rectangular frame (not shown in the drawings) to directly in contact with a portion of active region units 131a. In other words, while disposing the second active region 133, a portion of the active region units 131a may be further connected to the first edge 133a and the second edge 133b of the second active region 133, and another portion of the active region units 131a may be spaced apart from the first edge 133a and the second edge 133b of the second active region 133, as shown in FIGS. 1 and 2. Also, the first edge 133a and the second edge 133b may include the same maximum width T1, and the maximum width T1 is preferably greater than a maximum width "W" of each active region unit 131a, but is not limited thereto. With these arrangements, the second active region 133 is allowable to uniformly disperse the stress suffered from the active region units 131a and the shallow trench isolation 120, thereby obtaining a further reliable structure. However, in another embodiment (not shown in the drawings), the second active region 133 may optionally not contact with the active region units 131a, or the maximum width T1 of the first edge 133a and the second edge 133b may be optionally the same or smaller than the maximum width "W" of the active region units 131a. People in the art should fully realizes that the practical number of the first edge or the second edge may be further adjusted based on product requirements, or the second active region is not limited to present the rectangular frame, for example, further edges may be additionally disposed to make the second active region to present various shape.

It is noted that, the second active region 133 further includes a plurality of first openings 132 and a plurality of second openings 134 which are respectively disposed on the second edges 133b at two opposite sides. Namely, the first openings are sequentially arranged on the second edge 133b and the second openings are sequentially arranged on the another second edge 133b, as shown in FIG. 1 and FIG. 2. In one embodiment, the first openings 132 and the second openings 134 are not in alignment with each other in the second direction D2, and which have the same diameter O1 in the third direction D3, as shown in FIG. 1 and FIG. 2, but not limited thereto. It is also noted that, in the present embodiment the formation of the second active region 133 may also be accomplished by the patterning process of the substrate 110, and which may optionally be carried out together with the patterning process of the first active region 133. That is, in the present embodiment, the same or different mask layer(s) may be used to either simultaneously define or separately define the patterns of the first active region 131 and the second active region 133, followed by etching the substrate 110, and filling in the insulating material. Then, the first active region 131 and the second active region 133 may include the same material, namely the material of the substrate 110, and also, the first edge 133a and the second edges 133b of the second active region 133, and the active region units 131a which are connected with the first edge 133a and the second edges 133b may be monolithic, as shown in FIGS. 1 and 4. In this situation, the active region units 131a of the first active region 131 which are connected to the first edge 133a or the second edges 133b of the second active region 133 may be serve as an extension of the first edge 133a and the second edges 133b which is inwardly extended into the first region 101, so that, the second active region 133 may obtain a relative stable, strengthened structure to protect the first active region 131 disposed at the inner side. Then, the structural collapse or damage of the active structure 130 may be successfully avoided. However, people in the art should fully realize that the formation of the second active region is not limited to be accomplished through the aforementioned process, and may also be formed through other processes, for example being carried out separately from the formation of the first active region. As an example, in one embodiment, the fabricating process of the second active region may be performed before the fabricating process of the first active region, in which, the second active region may be formed firstly through the patterning process of the substrate, and the first active region is then formed by performing an epitaxial growth process (not shown in the drawings). Accordingly, the topmost surfaces of the second active region and first active region may not be leveled with each other. Otherwise, in another embodiment, the fabricating process of the second active region may also be performed after the fabricating process of the first active region, in which, the first active region is firstly formed through he patterning process of the substrate, and the second active region is then formed through a deposition process. Accordingly, the second active region and the first active region may include different materials, for example, the second active region may include polysilicon or a dielectric material which is different from that of the substrate.

Next, a plurality of gate structures, preferably being buried gate structures 140, is formed in the substrate 110, as shown in FIGS. 1 and 4. In the present embodiment, a plurality of trenches (not shown in the drawings) which is parallel with each other and extends along the third direction D3 is firstly formed in the substrate 110. Then, an interface dielectric layer 141 entirely covering surfaces of each of the trenches, a gate dielectric layer 143 covering bottom surfaces of each of the trenches, a gate electrode layer 145 filling up the bottom of each of the trenches, and a mask layer 147 filling up the top of each of the trenches, are sequentially formed in the trenches. Then, the topmost surface of the mask layer 147 may be coplanar with the top surface of the substrate 110, and each of the buried gate structures 140 may be therefore embedded in the substrate 110 to function like a word line (WL) of the semiconductor memory device 100 for receiving or transmitting voltage signals from each memory cell. After that, an insulating layer 150 is formed on the substrate 110, to entirely cover the substrate 110 and directly in contact with the buried gate structures 140 and the shallow trench isolation 120 disposed within the substrate 110. The insulating layer 150 for example includes an oxide-nitride-oxide (ONO) structure, but is not limited thereto.

Following these, at least a bit line (BL) 160 is formed on the substrate 110, and at least a contact 170 is formed on the at least a bit line 160 and at least a contact 190 is formed on the word line (namely, the buried gate structure 140), to respectively electrically connect to the at least a bit line 160 or the word lines (namely, the buried gate structure 140). As shown in FIG. 2 and FIG. 3, a plurality of bit lines 150 and a plurality of contacts 170, 190 are formed in the present embodiment, wherein each of the bit lines 160 is parallel and spaced from each other along the second direction D2, to cross the word lines (namely, the buried gate structure 140) disposed in the substrate 110, and to intersect the active region units 131*a*. Each of the bit lines further includes a semiconductor layer 162, a barrier layer 164, a conductive layer 166, and a mask layer 168 sequentially stacked from bottom to top on the insulating layer 150, with the semiconductor layer 162 for example including polysilicon or other suitable semiconductor materials, with the barrier layer 164 for example including titanium (Ti) or titanium nitride (TiN), with the conductive layer 166 for example including a low resistant metal like tungsten (W), aluminum (Al) or copper (Cu), and with the mask layer 158 for example including silicon oxide, silicon nitride, or silicon oxynitride, but not limited thereto. Furthermore, bit line contacts (BLCs, bot shown in the drawings) are also formed under a portion of the bit lines 160, and the bit line contacts may directly in contact with a portion of the active region units 131*a*, to electrically connect a transistor element (not shown in the drawings) disposed within the substrate 110 to accept or to transmit the voltage signals from each memory cell. On the other hand, the contacts 170, 190 are respectively disposed in a dielectric layer 172 disposed on the substrate 110, to connect to the bit lines 160 or the word lines (namely, the buried gate structure 140) underneath.

It is noteworthy that, each of the bit lines 160 crosses over the active structure 130, to partially overlap with the first active region 131 and the second active region 133 underneath, wherein a portion of the bit lines 161 partially overlap with the second edge 133*b* at one side (such as the left side of the bit lines 161 as shown in FIG. 2) of the second active region 133, and pass over the second openings 134 without overlapping the another second edge 133*b* at another side (such as the right side of the bit lines 161 as shown in FIG. 2) of the second active region 133, as shown in FIG. 2. Also, the portion of the bit lines 161 is further connected to contacts 171, and the contacts 171 are disposed at a first end (not shown in the drawing, for example referring to the left end of the bit lines 160 as shown in FIG. 2) to electrically connect thereto. On the other hand, another portion of the bit lines 163 pass over the first openings 134 to partially overlap with the second edge 133*b* at the another side of the second active region 133, as shown in FIG. 2. Also, the another portion of the bit lines 163 is further connected to contacts 173, and the contacts 173 are disposed at a second end (not shown in the drawing, for example referring to the right end of the bit lines 160 as shown in FIG. 2) to electrically connect thereto. Accordingly, while being seen through a top view as shown in FIG. 2, the bit lines 161, and the bit lines 163 are alternately arranged in the third direction D3, and also, each of the contacts 171 and the first openings 132 are alternately arranged in the third direction D3, and each of the contacts 173 and the second openings 134 are also alternately arranged in the third direction D3. In other words, each of the contacts 171 may be disposed between any two of the first openings 132, and each of the first openings 132 may also be disposed between any two of the contacts 171, in alignment with each of the bit lines 163, as well as the contacts 173 disposed thereon. Also, each of the contacts 173 may be disposed between any two of the second openings 134, and each of the second openings 134 may also be disposed between any two of the contacts 173, in alignment with each of the bit lines 161, as well as the contacts 171 disposed thereon. Additionally, the contacts 190 may also have a configuration similar to the contacts 170, for example, a portion of the word lines (namely, the buried gate structures 140) may be electrically connected to a portion of the contacts 190 through one end thereof (not shown in the drawings, for example the bottom end of each buried gate structure 140 as shown in FIGS. 1 and 2), and another portion of the word lines (namely, the buried gate structures 140) may be electrically connected to another portion of the contacts 190 through another end thereof (not shown in the drawings, for example the top end of each buried gate structure 140 as shown in FIGS. 1 and 2), but is not limited thereto. With these arrangements, the contacts 170, 190 may gain enough process window, and also, the voltage signals of the bit lines 160 will not be directly conducted to the voltage signals of the word lines (namely, the buried gate structures 140) through the second edges 133*b* of the second active region 133, thereby effectively avoiding the short circuit of the semiconductor memory device 100.

According to above arrangements, the semiconductor memory device 100 of the first preferable embodiment is achieved. The semiconductor memory device 100 includes the second active region 133 around at the outer side of the first active region 131, with a portion of the active region units 131a further connecting to the first edge 133a and the second edges 133b of the second active region 133 to uniformly disperse the stress suffered from the active region units 131a and the shallow trench isolation 120, thereby obtaining a relative reliable structure. Moreover, the first openings 132 and the second openings 134 are further disposed on the second active region 130, with the locations of the first openings 132 being in alignment with the bit lines 163 and the contacts 173 in the second direction D2, respectively, and with the locations of the second openings 134 being in alignment with the bit lines 161 and the contacts 171 in the second direction D2, respectively, thereby avoiding the direct connection of the bit lines 160 and the word lines (namely, the buried gate structure 140). In this way, the semiconductor memory device 100 of the present embodiment may therefore achieve an improved performance.

Figure 5:
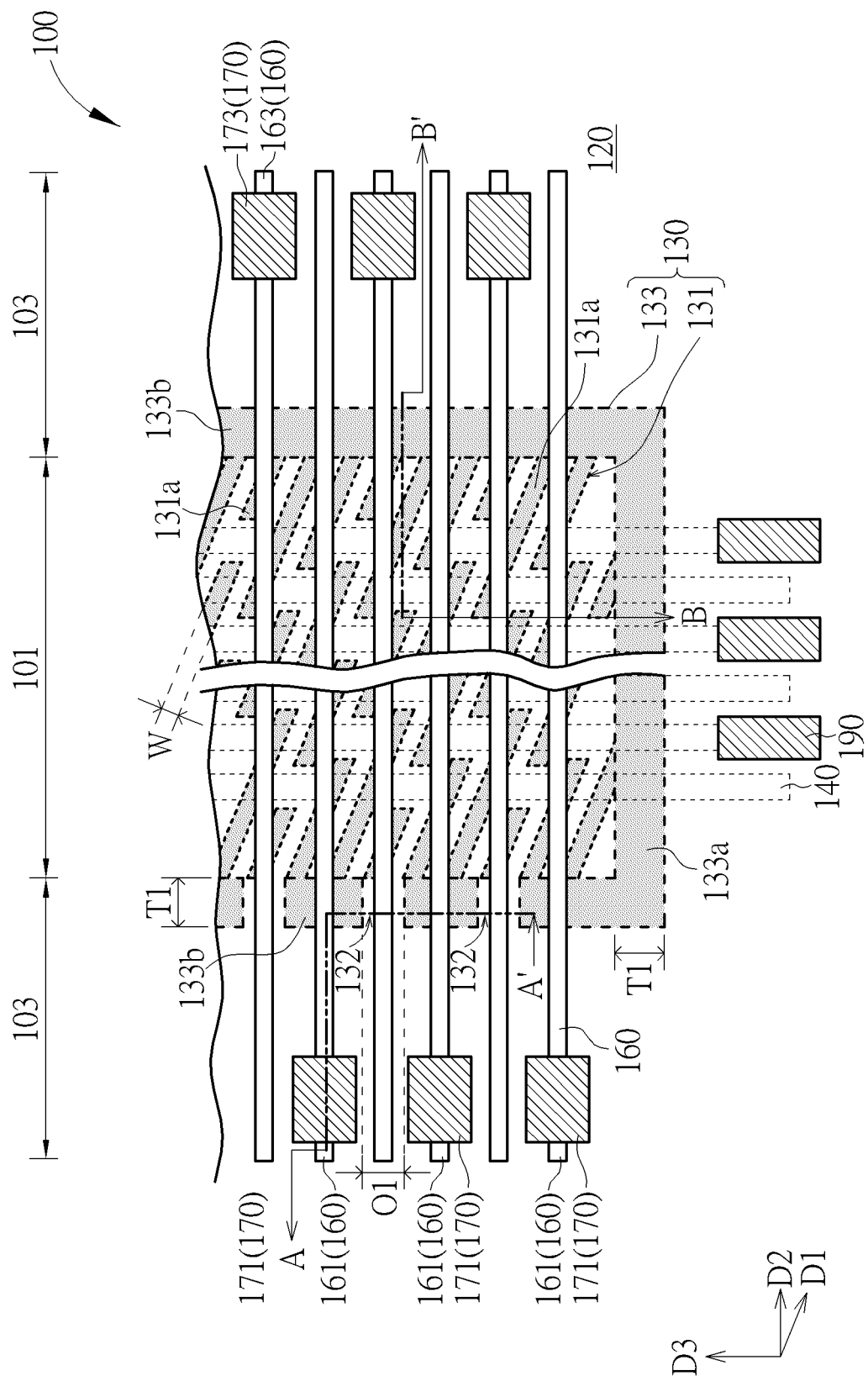
FIG. 5 is a schematic diagram illustrating a semiconductor memory device according to another embodiment in the present disclosure.

However, people in the art should fully realize that the semiconductor memory device and the fabricating method thereof are not be limited to aforementioned embodiment and may include other examples or may be achieved through other strategies to meet practical product requirements. For example, in one embodiment, the etching conditions may be further adjusted during the patterning process of the second active region 133 to form the active structure with rounding corners, but not limited thereto. Also, in another embodiment as shown in FIG. 5, the second openings 134 may be optionally omitted, and the semiconductor memory device 100a only includes the first openings 132 disposed on the second edges 133b of the second active region 130 for avoiding the direct connection of the bit lines 160 and the word lines (namely, the buried gate structure 140). The following description will detail the different embodiments of the semiconductor memory device and the fabricating method thereof in the present disclosure. To simplify the description, the following description will detail the dissimilarities among the different embodiments and the identical features will not be redundantly described. In order to compare the differences between the embodiments easily, the identical components in each of the following embodiments are marked with identical symbols.

Figure 6:
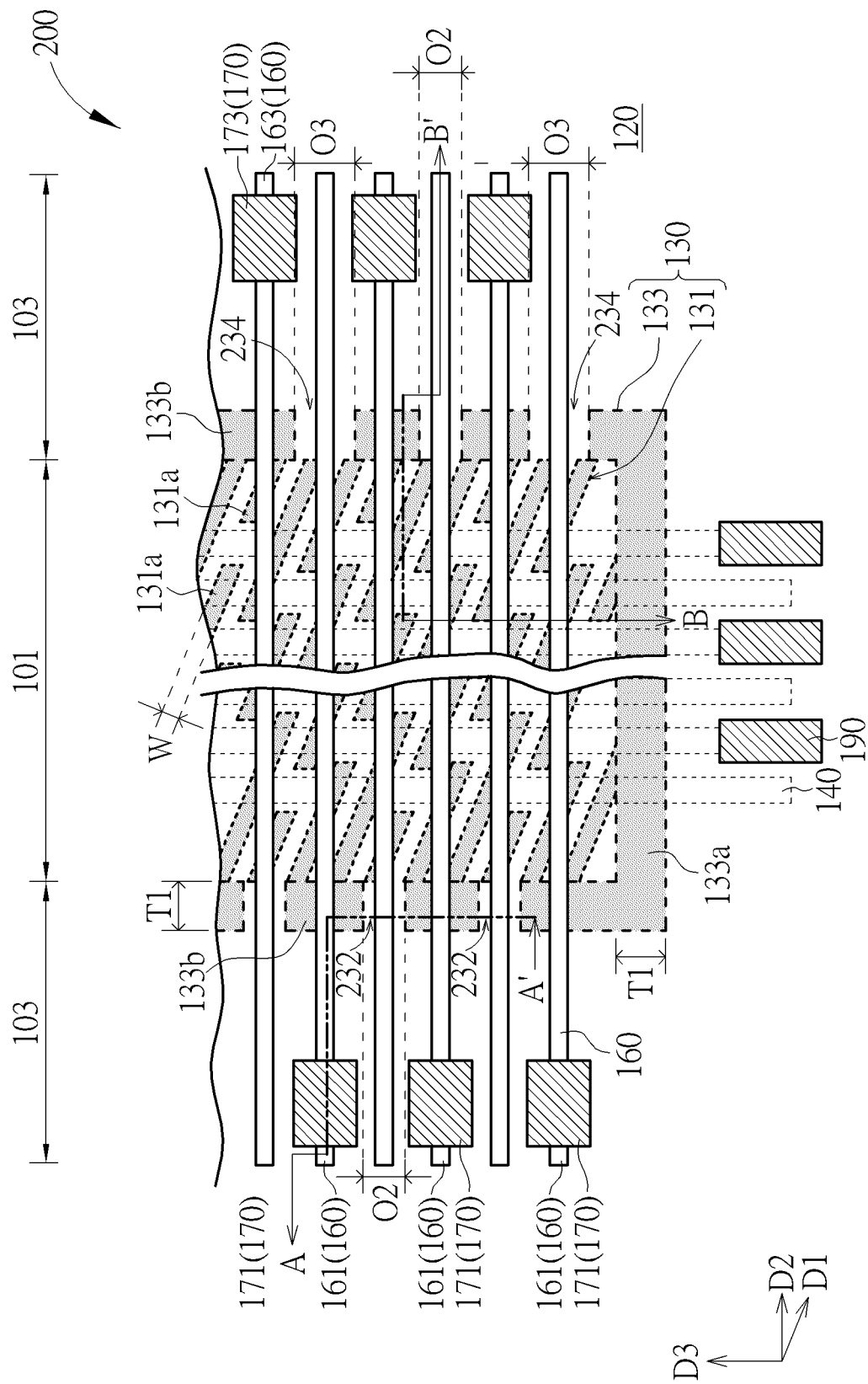
FIG. 6 is a schematic diagram illustrating a semiconductor memory device according to a second preferable embodiment in the present disclosure.

Please refer to FIG. 6, which illustrates a semiconductor memory device 200 according to the second preferable embodiment of the present disclosure. In the present embodiment, the structure of the semiconductor memory device 200 is substantially the same as those of the aforementioned first preferable embodiment, including the substrate 110, the shallow trench isolation 120, the active structure 130, the buried gate structures 140 (namely the word lines), the bit lines 160 and the contacts 170, 190, and which may not be redundantly described hereinafter. The difference between the semiconductor memory device 200 and the aforementioned semiconductor memory device 100 is in that a plurality of first openings 232 and a plurality of openings 234 disposed on the second edges 133b may include different diameters O2, O3.

Precisely speaking, the first openings 232 are sequentially disposed on one of the second edges 133b of the second active region 133, and the second openings 234 are sequentially disposed on another one of the second edges 133b of the second active region 133, as shown in FIG. 6. In the present embodiment, the first openings 232 and the second openings 234 are alternately arranged in the second direction D2, wherein the first openings 232 may optionally include the same diameter O2 in the third direction D3, and the second openings 234 may include different diameters O2, O3 in the third direction D3, but is not limited thereto. People in the art should fully realize that the diameters of the first openings 232 and the second openings 234 may have more variation due to practical product requirements. For example, in another embodiment, the diameters of the first openings and the second openings may all be different from each other, or the second openings may all include the same first diameter (not shown in the drawings) and the first openings may optionally include the same or different diameter(s).

With these arrangements, the locations of the first openings 232 may also be in alignment with the bit lines 163 and the contacts 173 respectively, in the second direction D2, and the locations of the second openings 234 may be in alignment with the bit lines 161 and the contacts 171 respectively, in the second direction D2, to prevent from the directly connection between the bit lines 160 and the word lines (namely, the buried gate structures 140). Then, the semiconductor memory device 200 of the second preferable embodiment of the present disclosure may also achieve an improved performance.

Figure 7:
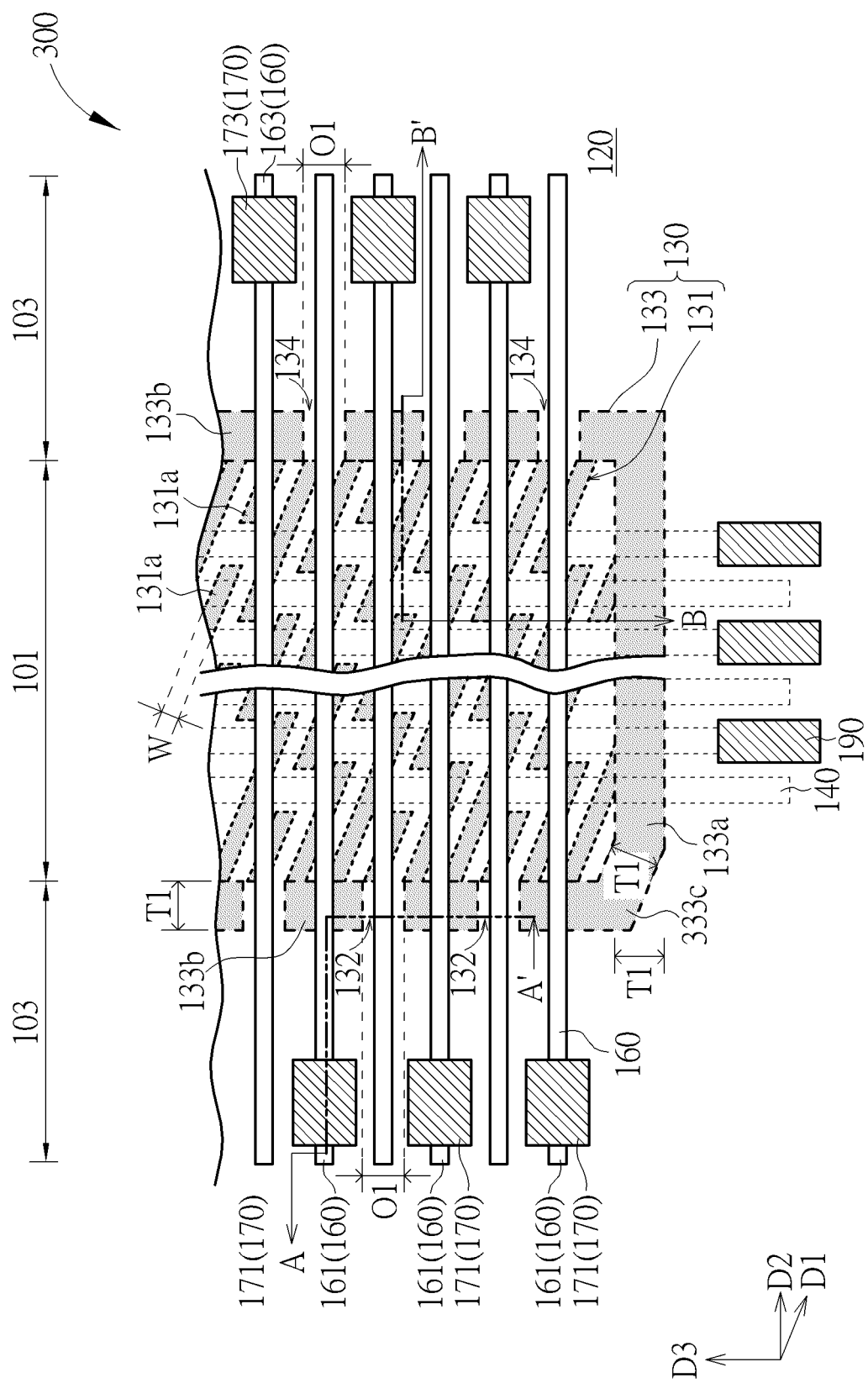
FIG. 7 is a schematic diagram illustrating a semiconductor memory device according to a third preferable embodiment in the present disclosure.

Please refer to FIG. 7, which illustrates a semiconductor memory device 300 according to the third preferable embodiment of the present disclosure. In the present embodiment, the structure of the semiconductor memory device 300 is substantially the same as those of the aforementioned first preferable embodiment, including the substrate 110, the shallow trench isolation 120, the active structure 130, the buried gate structures 140 (namely the word lines), the bit lines 160 and the contacts 170, 190, and which may not be redundantly described hereinafter. The difference between the semiconductor memory device 300 and the aforementioned semiconductor memory device 100 is in that the second active region 133 further includes at least a third edge 333c extending along the first direction D1.

Precisely speaking, the third edge 333c is for example disposed between the first edge 133a extending along the second direction D2 and the second edge 133b extending along the third direction D3, that is, the first edge 133a is adjacent to the third edge 333c, and the third edge 333c is adjacent to the second edge 133b, thereby making the second active region 133 to present like a polygon frame (not shown in the drawings) around the first active region 131. In the present embodiment, the third edge 333c for example includes a maximum width T1 which is the same as that of the first edge 133a and the second edge 133b, but is not limited thereto. In another embodiment, the third edge 333c may also include a relative greater width (not shown in the drawings), for example being greater than the maximum width T1 of the first edge 133a and the second edge 133b. People in the art should easily realize that the extending direction, as well as the practical disposing number, of the third edges may be adjustable due to product requirements, and the second active region may therefore present various shape and which is not limited to the aforementioned shape.

According to above arrangements, the second active region 133 may obtain a relative stable and strengthened structure through disposing the third edge 333c, so as to improve the stresses around the semiconductor memory device 300, thereby avoiding the structural collapse or damages. Meanwhile, the first openings 132 disposed on the second active region 133 is also in alignment with the bit lines 163 and the contacts 173 respectively, in the second direction D2, and the second openings 134 disposed on the second active region 133 is also in alignment with the bit lines 161 and the contacts 171 respectively, in the second direction D2, to prevent from the direct connection between the bit lines 160 and the word lines (namely the buried gate structures 140). In this way, the semiconductor memory device 300 of the third preferable embodiment of the present disclosure may also achieve an improved performance.

Figure 8:
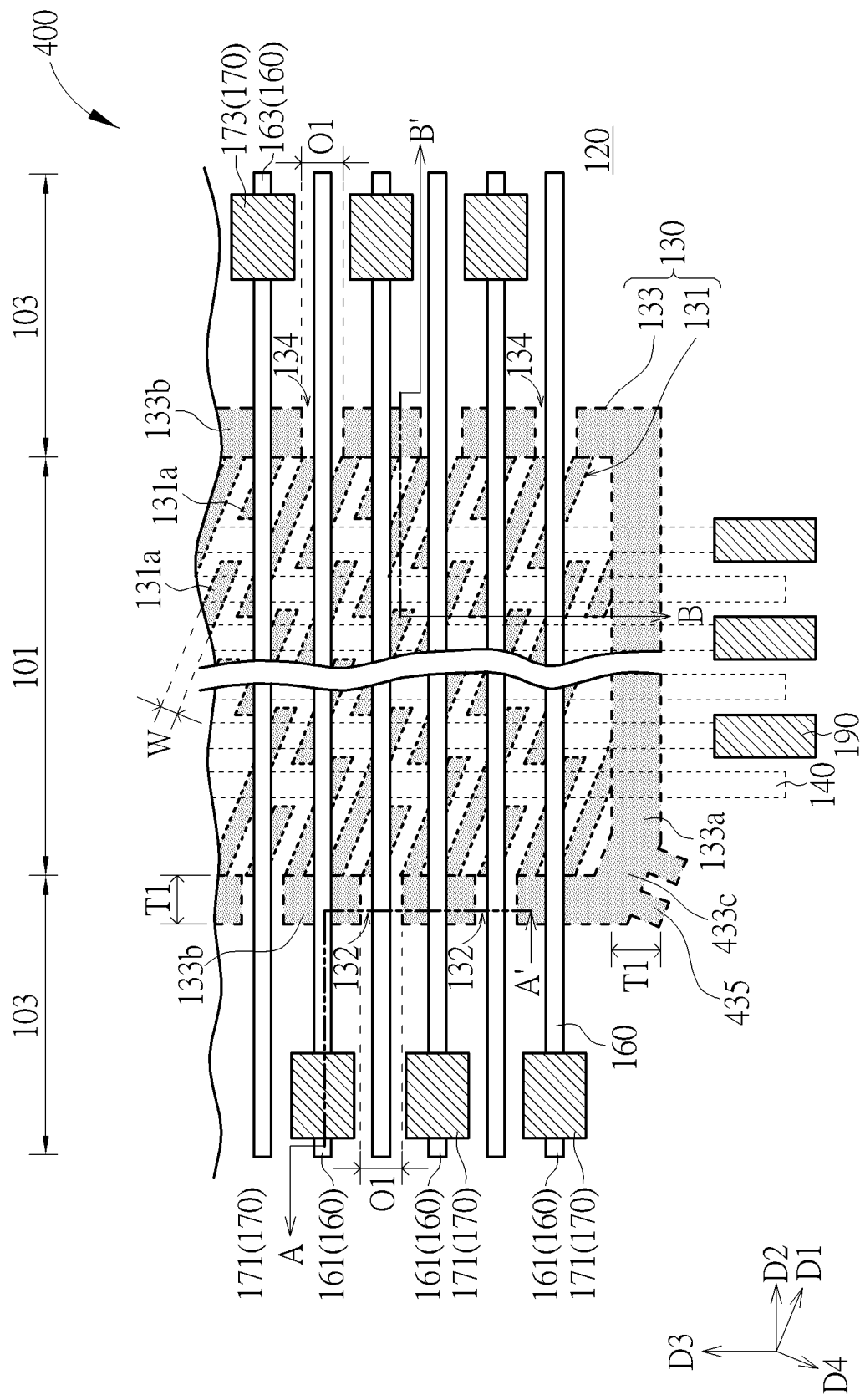
FIG. 8 is a schematic diagram illustrating a semiconductor memory device according to a fourth preferable embodiment in the present disclosure.

Please refer to FIG. 8, which illustrates a semiconductor memory device 400 according to the fourth preferable embodiment of the present disclosure. In the present embodiment, the structure of the semiconductor memory device 400 is substantially the same as those of the semiconductor memory device 300 in the aforementioned third preferable embodiment, including the substrate 110, the shallow trench isolation 120, the active structure 130, the buried gate structures 140 (namely the word lines), the bit lines 160 and the contacts 170, 190, and which may not be redundantly described hereinafter. The difference between the semiconductor memory device 400 and the aforementioned semiconductor memory device 300 is in that a plurality of protruding portions 435 is further disposed on the at least a third edge 433c.

Precisely speaking, the third edge 433c for example extends along the first direction D1, between the first edge 133a and the second edge 133b, so that, the second active region 133 may entirely present like a polygon frame (not shown in the drawings) around the first active region 131. The protruding portions 435 and the third edge 433c may be monolithic, and which is disposed at one side of the third edge 433c which is away from the first active region 131. Namely, the protruding portion 435 further extends outwardly into the second region 103, for example along a fourth direction D4 which is different from the first direction D1, the second direction D2 and the third direction D3, thereby additionally enhancing the structural strength outside the second active region 133.

According to above arrangements, the second active region 133 may obtain an enhanced structural strength through disposing the third edge 433c and the protruding portion s 435, so as to improve the stresses around the semiconductor memory device 400, thereby avoiding the structural collapse or damages. Also, people in the art should easily understand that the practical number, the shape and the size of the protruding portions may all be adjustable due to product requirements, and which are not limited to what is shown in FIG. 8. Meanwhile, the first openings 132 disposed on the second active region 133 is also in alignment with the bit lines 163 and the contacts 173 respectively in the second direction D2, and the second openings 134 disposed on the second active region 133 is also in alignment with the bit lines 161 and the contacts 171 respectively in the second direction D2, to prevent from the direct connection between the bit lines 160 and the word lines (namely the buried gate structures 140). In this way, the semiconductor memory device 400 of the third preferable embodiment of the present disclosure may also achieve an improved performance.

Overall speaking, according to the semiconductor memory device in the present disclosure, a second active region disposed around the first active region is disposed at the periphery of the device, and the openings are further disposed on the second active region. The locations of the openings is in alignment with particular bit lines and the contacts disposed on the particular bit lines, respectively, so that, it is sufficient to avoid the directly conduction between the bit lines and the word lines, to provide improved performance to the semiconductor memory device. Also, the second active region further includes the strengthened structure, such as the edges with relative greater thickness or the protruding portions, and the periphery of the device may therefore obtain a relative stable, strengthened structure to protect the elements disposed inside the device. Then, the semiconductor memory device of the present disclosure may achieve an improved performance.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A semiconductor memory device, comprising:
    a substrate;
    an active structure disposed in the substrate, the active structure comprising:
        a first active region comprising a plurality of active region units parallel with each other and extending along a first direction; and
        a second active region disposed at an outer side of the first active region, the second active region comprising a first edge extending along a second direction and a second edge extending along a third direction, and the first edge and the second edge directly connected to a portion of the active region units, wherein the second active region comprises a plurality of first openings, and the first openings are disposed on the second edge; and
    a shallow trench isolation, disposed in the substrate, the shallow trench isolation surrounding the active structure.

2. The semiconductor memory device accordingly to claim 1, further comprising:
    at least a bit line disposed on the substrate to intersect the active region units, the at least a bit line extending along the second direction, wherein the second direction is perpendicular to the third direction and is not perpendicular to the first direction.

3. The semiconductor memory device accordingly to claim 2, further comprising:
    at least a contact disposed on the at least a bit line to electrically connect the at least a bit line.

4. The semiconductor memory device accordingly to claim 3, wherein the at least a bit line comprise a plurality of first bit lines and a plurality of second bit lines, and the first bit lines and the second bit lines are alternately arranged along the third direction.

5. The semiconductor memory device accordingly to claim 4, wherein the at least a contact comprises a plurality of first contacts and a plurality of second contacts, wherein the first contacts are disposed on a first end of the first bit lines respectively, and the second contacts are disposed on a second end of the second bit lines respectively.

6. The semiconductor memory device accordingly to claim 5, wherein the first openings are disposed between any two of the first contacts.

7. The semiconductor memory device accordingly to claim 5, wherein the first openings are in alignment with the second contacts.

8. The semiconductor memory device accordingly to claim 5, further comprising:
    a plurality of second openings disposed on another second edge of the second active region, wherein the another second edge extends along the third direction and is opposite to the second edge, and each of the second openings is disposed between any two of the second contacts.

9. The semiconductor memory device accordingly to claim 8, wherein the second openings are in alignment with the first contacts.

10. The semiconductor memory device accordingly to claim 1, wherein the second active region further comprises at least a third edge, and the at least a third edge extends along the first direction and is disposed between the first edge and the second edge.

11. The semiconductor memory device accordingly to claim 10, wherein a maximum width of the third edge of the second active region is equal to a maximum width of the second edge or a maximum width of the first edge.

12. The semiconductor memory device accordingly to claim 10, wherein a maximum width of the third edge of the second active region is greater than a maximum width of the second edge, a maximum width of the first edge, or a maximum width of the active region units.

13. The semiconductor memory device accordingly to claim 10, further comprising:
   a plurality of protruding portions disposed on the at least a third edge of the second active region.

14. The semiconductor memory device accordingly to claim 2, wherein the first edge of the second active region is parallel with the at least a bit line.

* * * * *